(12) United States Patent
Dietrich et al.

(10) Patent No.: US 7,215,263 B2
(45) Date of Patent: May 8, 2007

(54) PARALLEL-SERIAL CONVERTER

(75) Inventors: Stefan Dietrich, Türkenfeld (DE); Thomas Hein, München (DE); Peter Schroegmeier, München (DE)

(73) Assignee: Infineon Technologies AG, Munich (DE)

( * ) Notice: Subject to any disclaimer, the term of this patent is extended or adjusted under 35 U.S.C. 154(b) by 215 days.

(21) Appl. No.: 11/089,034

(22) Filed: Mar. 25, 2005

(65) Prior Publication Data

US 2005/0216623 A1    Sep. 29, 2005

(30) Foreign Application Priority Data

Mar. 26, 2004   (DE)   ...................... 10 2004 014 973

(51) Int. Cl.
*H03M 9/00*   (2006.01)
(52) U.S. Cl. ...................... 341/101; 341/100
(58) Field of Classification Search ................ 341/101, 341/100
See application file for complete search history.

(56) References Cited

U.S. PATENT DOCUMENTS

| | | | | |
|---|---|---|---|---|
| 5,247,652 A | * | 9/1993 | Uda | .................... 710/71 |
| 5,612,695 A | * | 3/1997 | Ueda | ................... 341/101 |
| 5,612,696 A | * | 3/1997 | Kim | .................... 341/136 |
| 5,654,707 A | * | 8/1997 | Matsumoto | .......... 341/101 |
| 5,982,309 A | * | 11/1999 | Xi et al. | ............... 341/101 |
| 6,970,117 B1 | * | 11/2005 | Lui et al. | .............. 341/101 |
| 7,091,890 B1 | * | 8/2006 | Sasaki et al. | ........... 341/100 |
| 2002/0057614 A1 | | 5/2002 | Kanazashi | |
| 2006/0192701 A1 | * | 8/2006 | Kobayashi | ............ 341/101 |

OTHER PUBLICATIONS

German Office Action dated Dec. 14, 2004, issued in counterpart foreign application.

* cited by examiner

*Primary Examiner*—Linh Nguyen
(74) *Attorney, Agent, or Firm*—Morrison & Foerster LLP

(57) ABSTRACT

The invention relates to a parallel-serial converter for converting parallel data into serial data, in particular for or in a DDR semiconductor memory, having at least n input terminals at which n data signals are present in parallel, an output terminal for outputting a serial data signal, a controllable latch connected to the input terminals on the input side, a common storage node, which is connected to outputs of the latch and which holds a data signal of the controllable latch present last, a controllable bypass device, which has an input, which is coupled to the storage node on the output side and which has a control terminal, via which a predeterminable state present at the input of the bypass device can be switched onto the storage node. The invention furthermore relates to a semiconductor memory having such a parallel-serial converter and to a method for operating such a parallel-serial converter.

16 Claims, 5 Drawing Sheets

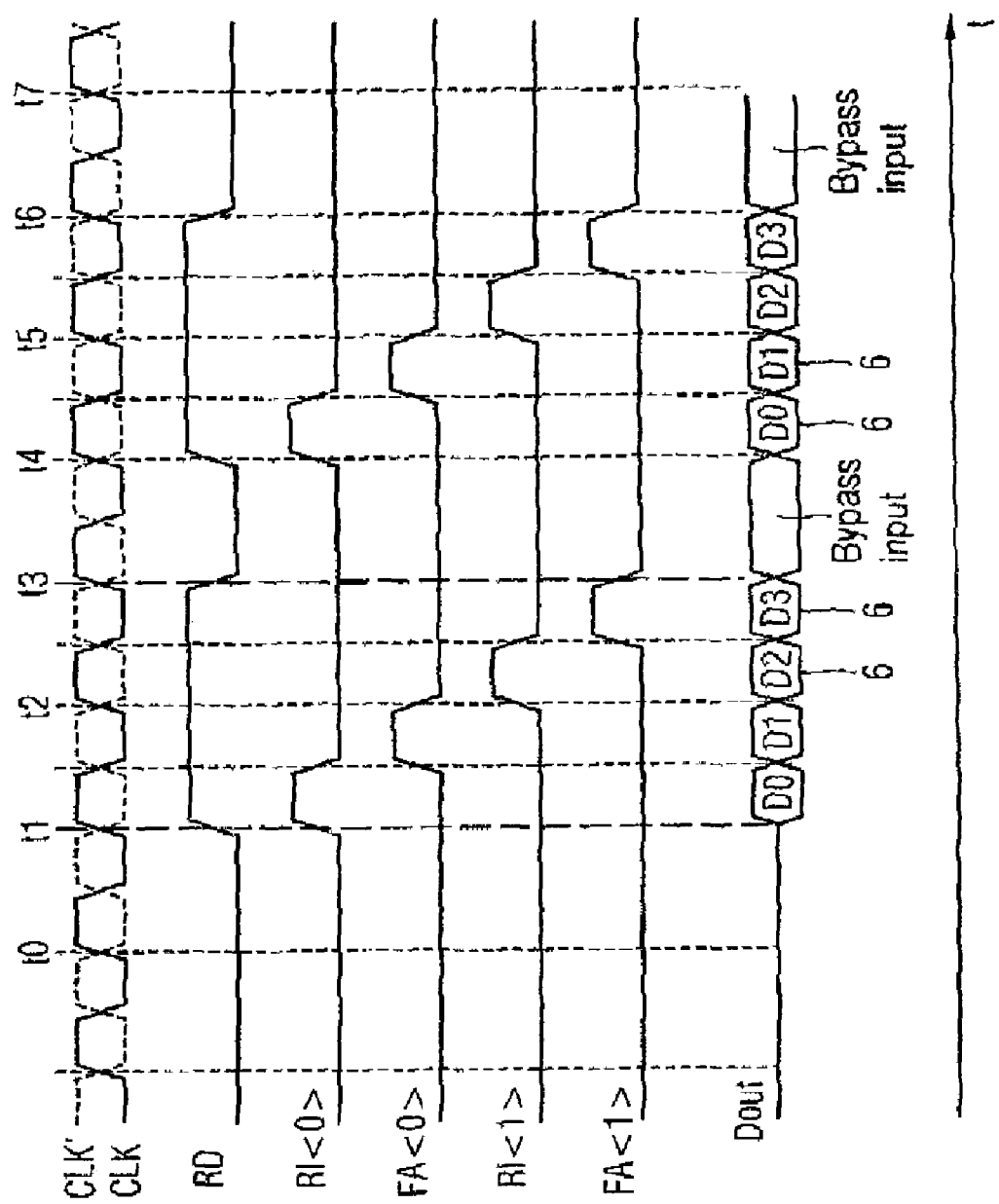

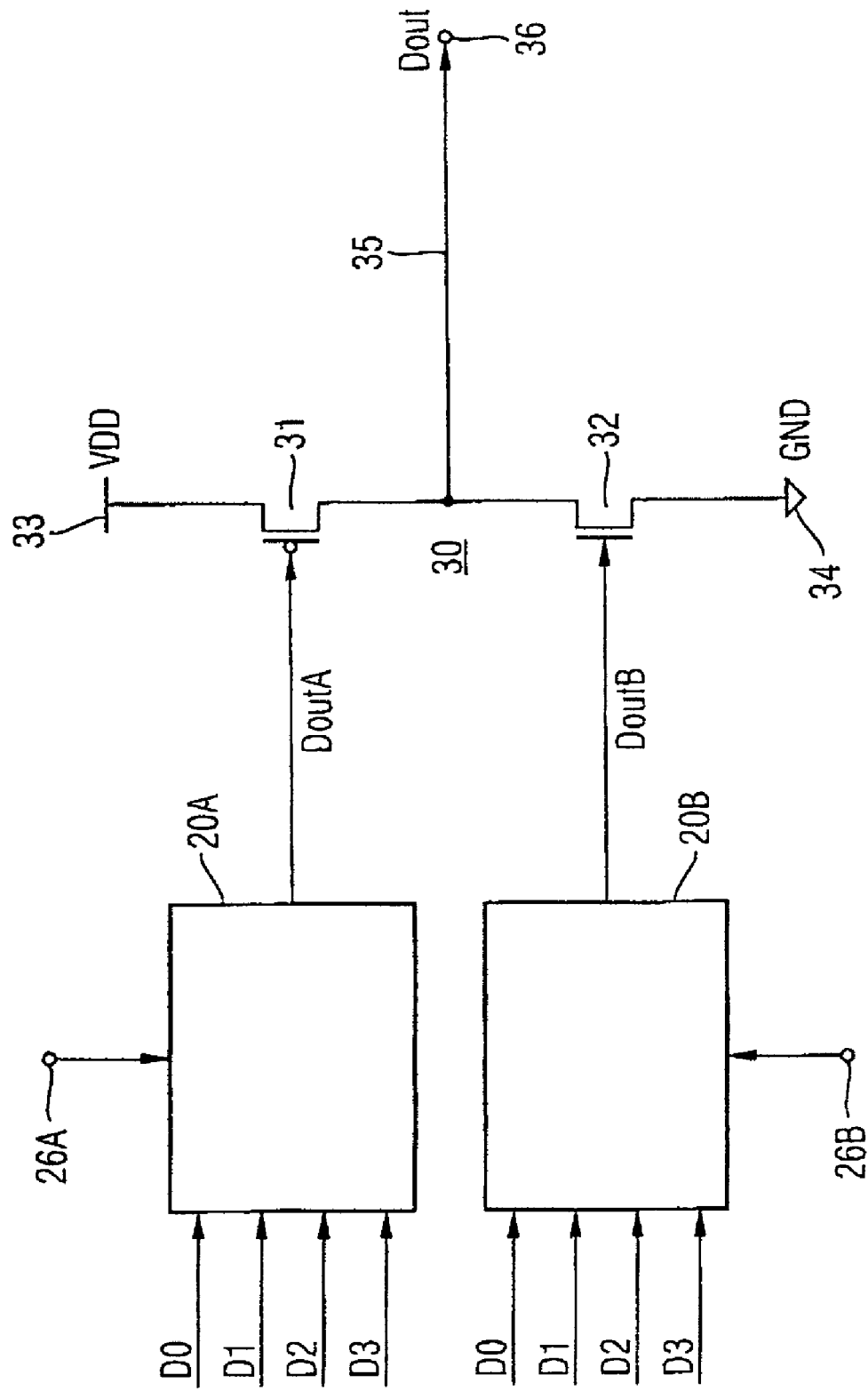

PARALLEL-SERIAL CONVERTER

CLAIM FOR PRIORITY

This application claims priority to German Application No. 10 2004 014 973.9 filed Mar. 26, 2004, which is incorporated herein, in its entirety, by reference.

TECHNICAL FIELD OF THE INVENTION

The invention relates to a parallel-serial converter for converting parallel data into serial data. The invention furthermore relates to a semiconductor memory, in particular a DDR-SDRAM semiconductor memory, having such a parallel-serial converter and to a method for operating the parallel-serial converter.

BACKGROUND OF THE INVENTION

In modern computer and software applications there is increasingly a demand for ever larger volumes of data to be processed in an ever shorter time. Large scale integrated memories, such as DRAM memories for example, are used for storing the data. In order, then, to meet the aforementioned demand for an ever higher speed when processing data, it is necessary, in the case of such a semiconductor memory, for said data to be written to the memory and read out from said memory again appropriately rapidly.

As development advances in the field of integrated circuits, the operating frequency thereof rises, too, so that the data can be processed appropriately rapidly.

What is more, semiconductor memories also exist which are specially designed for high data rates. One representative of such a semiconductor memory is the so-called DDR-DRAM memory, where DDR stands for "double data rate". Whereas in conventional semiconductor memories write and read operations are performed only upon the rising edge or the falling edge of a clock signal, in DDR semiconductor memories data are read out from the semiconductor memory and written to the semiconductor memory again both upon the rising edge and upon the falling edge of the clock signal. A double data rate is thus realized.

In the case of these DDR-DRAM semiconductor memories, the double data rate present externally at the semiconductor memory is converted internally into a single data rate and written in parallel to the semiconductor memory. In the case of a read access, however, the data present in parallel internally in the semiconductor memory have to be converted into a serial data stream again. For this purpose, the semiconductor memory or the interface circuit thereof is equipped with a parallel-to-serial converter—referred to hereinafter just as parallel-serial converter for short. An integrated circuit with an interface circuit having such a parallel-serial converter is described in U.S. Pat. No. 6,317,372.

In the simplest case, a parallel-serial converter is designed as a controllable shift register. A parallel-serial converter has a number of cascade-connected flip-flops corresponding to the number of input terminals. Furthermore, a control signal generated by means of a multiplexer may be provided for controlling the shift register. The construction and the method of operation of such a parallel-serial converter designed as a controllable shift register are known in many instances and described for example in Kories, Schmidt-Walter, Taschenbuch der Elekrotechnik, [Pocketbook of electrical engineering], Wissenschaftlicher Verlag Harri Deutsch GmbH, 5th corrected edition, 2003.

FIG. 1 uses a simple block diagram to show a simplified illustration of a generally known parallel-serial converter. The parallel-serial converter has four input terminals 1–4 and a single output terminal 5. Furthermore, four controllable inverters 7–10 arranged in parallel with one another are provided, which can respectively be controlled by means of control signals RI0, FA0, RI1, FA1. Data D0–D3 are present in parallel at the respective input terminals 1–4 and are read into a respective inverter 7–10 successively by means of control signals RI0, FA0, RI1, FA1 and applied to the common storage node 11. Two further inverters 12, 13 are connected downstream of the storage node 11. Furthermore, a feedback inverter 14 is provided, which is connected back-to-back with respect to the inverter 12 and is intended to hold the last state of the inverter 12 and thus the last state at the storage node 11.

FIG. 2 shows a signal timing diagram illustrating the sequence of the clock signal CLK, the control signals RI0, FA0, RA1, FI1 and the serial data signal Dout at the output 5 of the known circuit arrangement from FIG. 1. By means of latching the data D0–D3, the parallel-serial converter serializes the data signals D0–D3 present in parallel on the input side. The last state, that is to say the state assigned to the data packet D3, is held after the process of reading out the data signals D0–D3 has ended, that is to say at the instant t3. The storage node 11 then has said last state even when a read access does not actually take place and, consequently, no data actually have to be converted in the parallel-serial converter. The state is then held until a renewed memory access takes place, that is to say at the instant t4 in the present example.

Distortions of the data read out may occur during the conversion of the data, as well as during the driving of the data via the read line. The parallel-serial converter is arranged in the read part of the data path as the last circuit part directly upstream of the output driver. A distortion caused in whatever manner would have a serious effect on the data transmission since said distortion is equally concomitantly transmitted via the output driver. The arrangement of the parallel-serial converter directly upstream of the output driver thus makes it indispensable for the signal shape provided on the output side to be distorted as little as possible by the parallel-serial converter since otherwise a high quality of the data transmitted via the read part of the data path to the microcontroller is no longer ensured.

Large distortions in the data to be transmitted and thus a reduced quality furthermore has the effect of greatly restricting the maximum operating frequency as a result since the temporal width of an individual data eye 6 to be transmitted is blurred to a greater or lesser extent in the case of such distortions. A defined transition from one data eye 6 to the next is then no longer discernible as such, or is discernible as such only with very great difficulty, by the microcontroller that processes the data read out, with the result that, overall, a read-out of serial data present in dedicated fashion is no longer ensured.

The abovementioned distortions are undesirable but can never be entirely avoided. Said distortions should nonetheless be kept as low as possible. In the case of known parallel-serial converters in accordance with FIG. 1, the feedback inverter 14 makes the principal contribution to the corruption of the serially transmitted data signals and thus to the aforementioned distortions. In order to be able to hold the last state, said feedback inverter 14 must be "exaggerated" as it were, that is to say it must be made smaller than the inverter 12. However, this inevitably leads to the distortions.

The abovementioned distortions are dependent in particular on process fluctuations, that is to say that the greater the process fluctuations in the production of the feedback inverter 14, the more distortions in the transmitted data signals are to be reckoned with. However, said process fluctuations will have a more and more serious effect primarily in the case of future memory technologies in which the trend is toward ever smaller feature sizes, so that ever greater distortions in the data to be transmitted are to be reckoned with in this case.

This is a state which, understandably, is to be avoided.

SUMMARY OF THE INVENTION

The present invention provides a parallel-serial converter, an application for the parallel-serial converter and a method for operating the parallel-serial converter which ensure the least possible distortions of the data packets to be transmitted.

In one embodiment of the invention, there is a:

Parallel-serial converter for converting parallel data into serial data, in particular for or in a DDR semiconductor memory, having at least n input terminals at which n data signals are present in parallel, and having an output terminal for outputting a serial data signal, having a controllable latch connected to the input terminals on the input side, having a common storage node, which is connected to outputs of the latch and which holds a data signal of the controllable latch present last, having a controllable bypass device, which has an input, which is coupled to the storage node on the output side and which has a control terminal, via which a predeterminable state present at the input of the bypass device can be switched onto the storage node.

Semiconductor memory, in particular DDR semiconductor memory, having a cell array having a multiplicity of individual memory cells which can be read via a read path, the read-out being controllable by means of a control device connected to the cell array via at least one control path, at least one parallel-serial converter according to the invention being arranged in the read path between the cell array and the read line.

Method for operating a parallel-serial converter according to the invention, having a first operating mode, in which data signals present in parallel at the input terminals of the parallel-serial converter are processed, and a second operating mode, in which no parallel data signals are present at the input terminals of the parallel-serial converter, the potential at the common storage node of the parallel-serial converter being set in a targeted manner by means of a bypass device in the second operating mode.

The present invention considers replacing the feedback inverter, which, in a parallel-serial converter, is critically responsible for distortions of the data signals to be transmitted via the read line, by a bypass device with a suitable driving. It is advantageous that the signal quality of the data signals to be transmitted is not impaired by the bypass device according to the invention. Rather, the signal quality of the data to be transmitted even increases as a result of the feedback inverter being omitted and through the use of a controllable bypass device.

Since such a bypass device can be realized in a very simple manner, only a slightly greater additional outlay on circuitry, or none at all, is required for this functionality. Moreover, chip area is also saved as a result of the feedback inverter being omitted.

In an advantageous embodiment, the bypass device has a controllable transfer gate. The controllable transfer gate can advantageously be driven by means of an OR gate connected upstream of the control terminal, the n different control signals being fed to the OR gate on the input side. This makes it possible to ensure that, as soon as data signals are present at the inputs of the parallel-serial converter, the controllable bypass device is inactive. It is for cases wherein no data signals whatsoever are present at the inputs of the parallel-serial converter that the bypass device is activated and a fixed potential is applied to the common storage node.

Either a fixed potential, for example a logic high level ("1"), or a tristate potential may be applied to the common storage node. In this way, the output of the storage node can be switched to a tristate state in a targeted manner depending on the information fed in, by way of example. It is particularly advantageous, furthermore, if an adjustable value is applied to the common storage mode via the bypass device. A programming of the storage node can be realized in this way, for example by writing a digital value corresponding to the desired application to the common storage node.

The buffer store connected upstream of the storage node is advantageously designed as a controllable shift register. A controllable shift register of this type is equipped with simple flip-flops in a very simple form. In the simplest configuration, the buffer store has a number of controllable inverters corresponding to the number of input terminals, the inverters being arranged in parallel with one another with regard to their input terminals and output terminals.

The controllable inverters are more advantageously designed as tristate inverters.

A control device is advantageously provided, by means of which the individual data signals which are present in parallel can be read successively into the latch and can be switched onto the storage node.

A multiplexer is advantageously provided, which is connected upstream of the control terminals of the controllable latch and which derives control signals for driving the second inverters from a clock signal for the clock supply of the parallel-serial converter.

The invention furthermore relates to a semiconductor memory, in particular to a DDR semiconductor memory. According to another embodiment of the invention, in this case at least one parallel-serial converter is provided between the read line via which the data to be read out can be read out and the cell array. In one refinement of the invention, each read path is assigned at least two parallel-serial converters which, on the output side, are connected to in each case a single output driver for driving the data read out. In this case, a respective transistor of said output driver is driven by one of the parallel-serial converters on the control side.

In another embodiment according to the invention, a first operating mode is, in which data signals present in parallel at the input terminals are processed. Furthermore, a second operating mode is provided, in which there are not actually any data signals present in parallel. In the second operating mode, according to the invention, a predeterminable potential is applied to the common storage node in a targeted manner. The potential may be a high-impedance tristate potential, by way of example. As an alternative, it would also be conceivable for an adjustable, digital value to be applied to the common storage node in the second operating mode. A programming of the common storage node is possible as it were in this way.

In another advantageous embodiment, a control signal for controlling the bypass device is derived from the different data signals present at the parallel inputs of the parallel-serial converter.

BRIEF DESCRIPTION OF THE DRAWINGS

The invention is explained in more detail below on the basis of the exemplary embodiments specified in the figures of the drawing, in which:

FIG. 4 shows signal timing diagrams for illustrating the latching of data present in parallel in the case of the parallel-serial converter according to the invention from FIG. 3.

FIG. 5 shows a schematic block diagram of two parallel-serial converters according to the invention with an output driver connected downstream, said converters being arranged in the read path of a semiconductor memory.

In the figures of the drawings, identical or functionally identical elements, data and signals have been provided with the same reference symbols, unless specified otherwise.

DETAILED DESCRIPTION OF THE INVENTION

Figure 1:
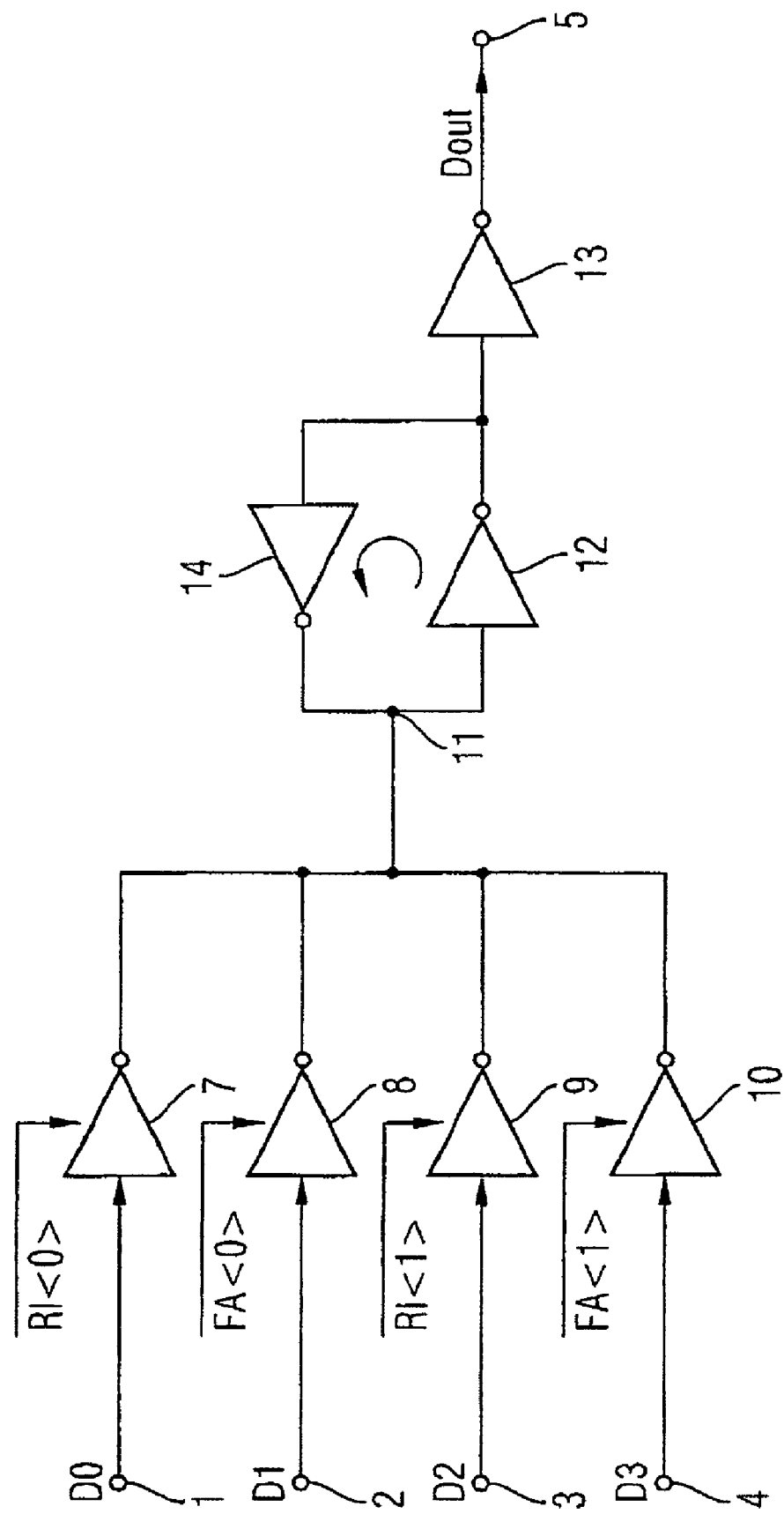
FIG. 1 shows a block diagram of a known parallel-serial converter illustrated in simplified fashion.
Figure 2:
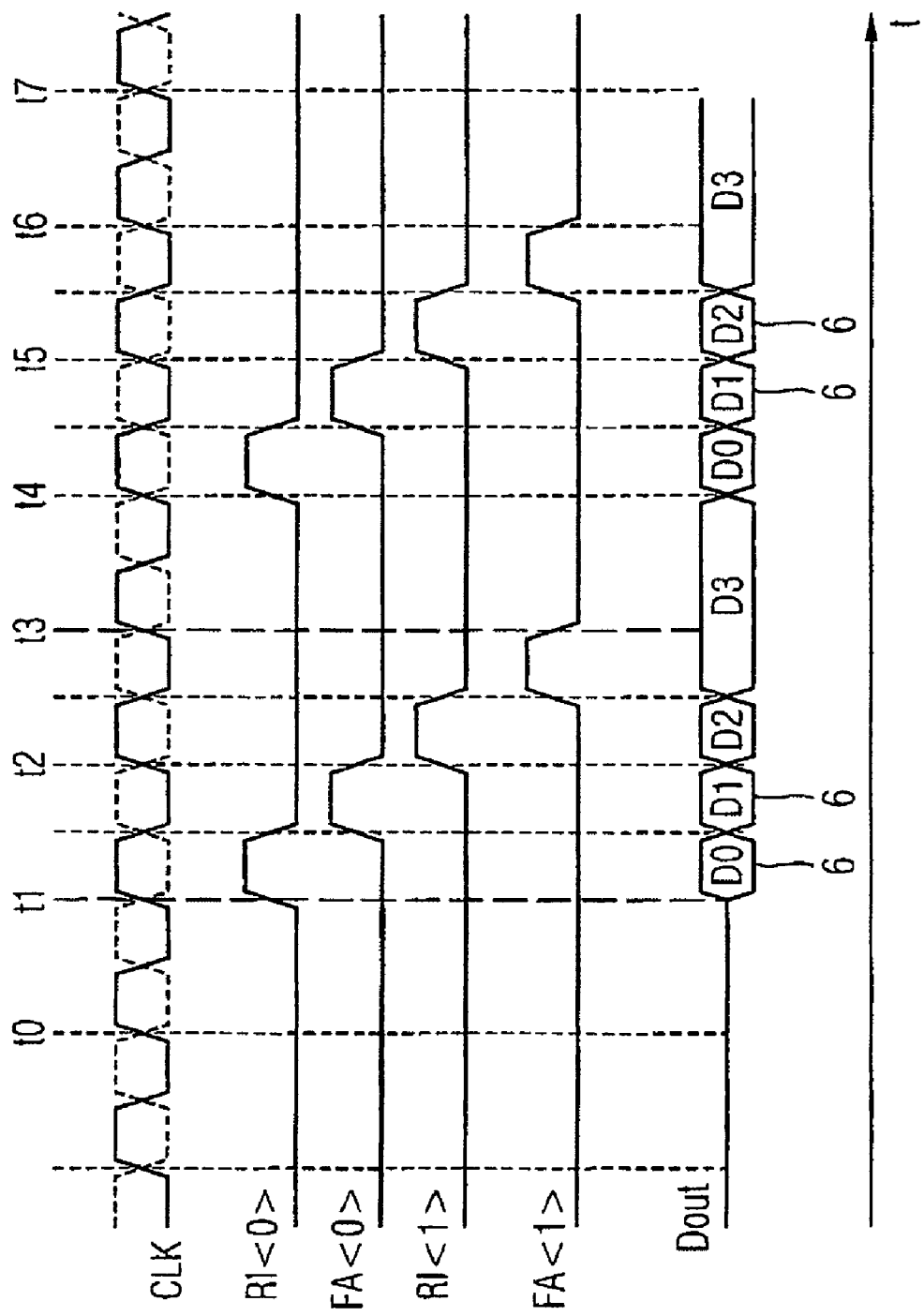
FIG. 2 shows signal timing diagrams for illustrating the latching of data present in parallel in the case of known parallel-serial converter from FIG. 1.
Figure 3:
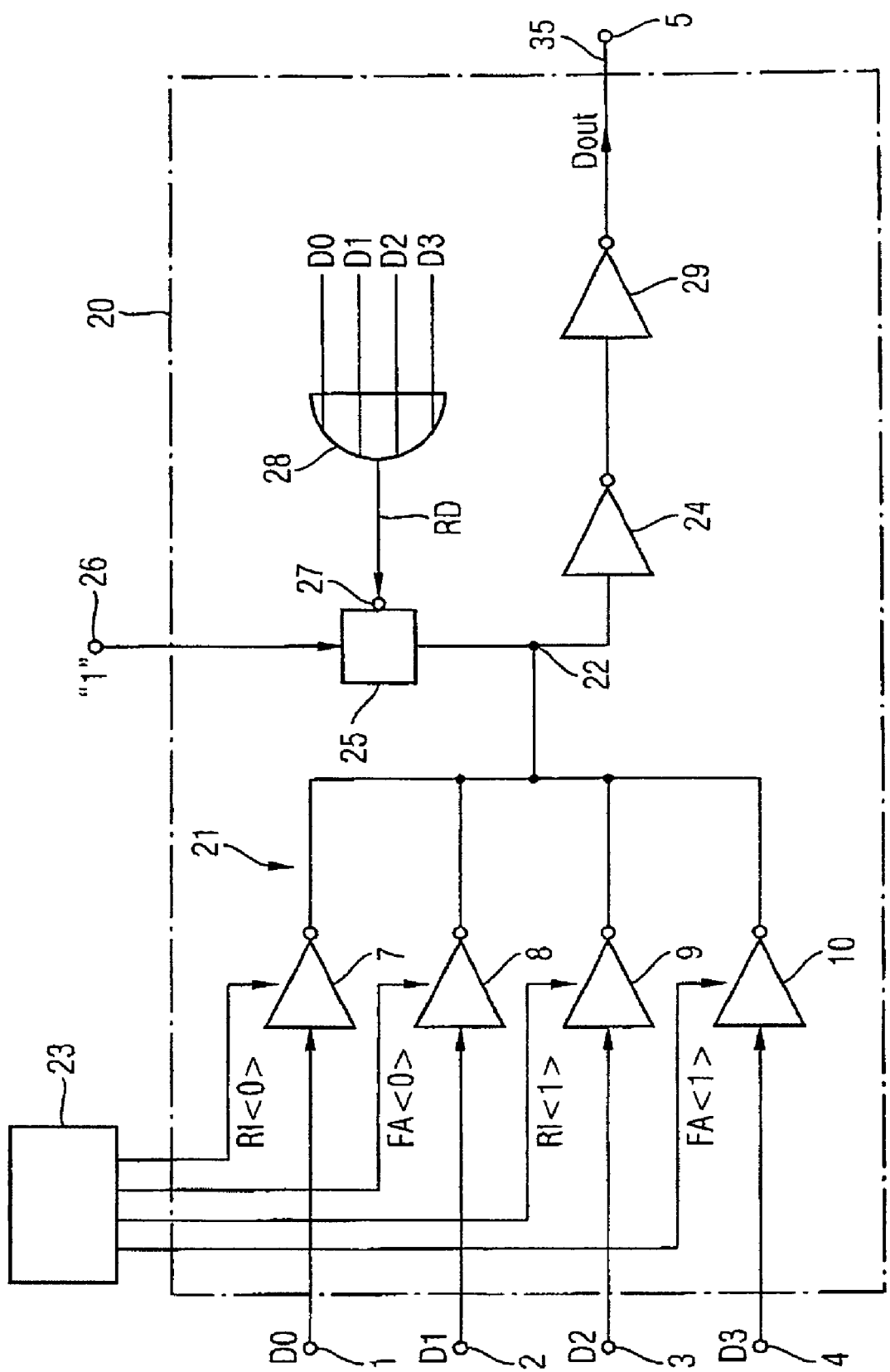
FIG. 3 shows a block diagram of a parallel-serial converter according to the invention illustrated in simplified fashion.

FIG. 3 shows a block diagram of a parallel-serial converter 20 according to the invention illustrated in simplified fashion, for a semiconductor memory (not illustrated), for example a DDR-SDRAM semiconductor memory designated. The construction and the method of operation of such a semiconductor memory 1 are generally known, and so this need not be discussed in any greater detail below. In the case of a so-called prefetch-4 read operation, 32-bit-wide data words are read out from the memory cell array in the present exemplary embodiment. Said data words are in each case split into four groups of 8 bits. Each of these groups is also referred to as a data packet.

It shall be assumed below that 32 bits are read out by means of a read access to the semiconductor memory, which bits are then divided between four data packets DQ0–DQ3 each with 8 bits. A respective data packet DQ0–DQ3 thus has 8 bits and thus one data word. In this case, the duration of a data packet DQ0–DQ3 corresponds to the duration of two clock cycles of the system clock CLK. This also corresponds to the applicable specification for so-called DDR-SDRAM semiconductor memories produced at the present time. Such a read-out operation in which 32 bits are read out simultaneously is generally also referred to as a data burst or as a "burst" for short.

The parallel-serial converter 20 has four input terminals 1–4 arranged in parallel with one another and also an output terminal 5. The data signals D0–D3 are present in parallel at the inputs 1–4. The parallel-serial converter 20 furthermore has a buffer store 21 designed as a controllable latch. A common storage node 22 is connected downstream of the buffer store 21. In the present exemplary embodiment, the buffer store 21 has four inverters 7–10, which are in each case connected to one of the input terminals 1–4 on the input side and which are in each case connected to the common storage node 22 on the output side. Tristate inverters are advantageously provided as the inverters 7–10 in this case. The inverters 7–10 furthermore in each case have a control terminal via which the inverters 7–10 can be controlled. A control device 23 is provided for this purpose, which in each case provides a control signal FA0, RI0, FA1, RI1 for each inverter 7–10.

The control signals FA0, RI0, FA1, RI1 for controlling the inverters 7–10 are advantageously derived from a clock signal CLK and a complementary clock signal CLK' with respect thereto. In this case, the individual data signals D0–D3 and thus the corresponding inverters 7–10 are switched through upon different edges of the clock signal CLK and the complementary clock signal CLK' with respect thereto. This is referred to as "latching" the data, the signal RI denoting latching with the rising edge and the signal FA denoting latching with the falling clock edge of the clock signal CLK.

The common storage node 22 includes an inverter 24 connected to the storage node 22 on the input side. Furthermore, a controllable transfer gate 25 is provided, which is connected to the storage node 22 on the output side. The transfer gate 25 has a bypass input 26, at which a high logic level ("1"), for example, is present. The transfer gate 25 furthermore has a control terminal 27 connected to an output of an OR gate 28. The OR gate 28 is connected to control terminals on the input side, so that the control signals FA0, RI0, FA1, RI1 are fed to the OR gate 28 on the input side. Depending on its control signals FA0, FA1, FI0, FI1, the OR gate 28 generates a control signal RD for controlling the transfer gate 25.

Connected downstream of the inverter 24 is a further output inverter 29, which is connected to the output terminal 5 on the output side and which thus provides the data signal Dout to be transmitted via the read line 35.

The method of operation of the parallel-serial converter 20 according to the invention, and in particular the transfer gate 25 thereof, will be explained in more detail below with reference to the signal timing diagram in FIG. 4.

For the case where no control signals FA0, RI0, FA1, RI1 are present at the control terminals, this is detected by means of the OR gate 28. For the case where control signals FA0, RI0, FA1, RI1 are present, for example in the time period t1<t<t3, the OR gate 28 outputs, on the output side, a control signal RD having a high logic level. In these cases, the potential at the common storage node 22 is determined by the outputs of the respective inverters. The control signal RD is at a low logic level only for those cases in which no data signals D0–D3 are present, for example in the time period t3<t<t4. In these cases, the bypass device 25 is activated, so that the signal present at the bypass input 26 is applied to the common storage node 22.

FIG. 5 uses a schematic block diagram to show two parallel-serial converters 20a, 20b according to the invention which are arranged in a read path 37 of a semiconductor memory. The parallel-serial converters 20a, 20b advantageously have a construction illustrated in accordance with FIG. 3.

An output driver 30 is furthermore provided. In the present example, the output driver has a PMOS transistor 31 and an NMOS transistor 32, which are arranged in series with regard to their controlled paths and between the terminal 33 having a positive supply potential VDD and the terminal 34 having a reference potential GND. In this case, a respective parallel-serial converter 20A, 20B drives a control terminal of a transistor 31, 32. The output of the output driver 30 is connected to the read line 35.

The PMOS transistor 31 is designed to drive a data signal DoutA having a high logic level ("1") that is provided by the parallel-serial converter 20A on the output side via the read line 35, whereas the NMOS transistor 32 is designed to drive a data signal DoutB having a low logic level ("0") that is provided by the parallel-serial converter 20B on the output side via the read line 35. If the two transistors 31, 32, as in the present example, are driven separately, then a total of three states can be realized on the read line 35:

1. High logic level ("1") if a low logic level is present in each case at the two control terminals 26A, 26B.
2. Low logic level ("0") if a high logic level is present in each case at the two control terminals 26A, 26B.
3. High-impedance so-called tristate state if a high logic level is present at the terminal 26A and a low logic level is present at the terminal 26B.

The first two states are typically used when data signals D0–D3 are in each case present at the parallel-serial converters 20A, 20B and, consequently, data signals Dout are intended to be transmitted via the read line 35 during this read access. After the end of a read access, the output 36 is automatically switched to a tristate state again by the output driver 30 and also the parallel-serial converters 20A, 20B being driven correspondingly.

Although the present invention has been described above on the basis of a preferred exemplary embodiment, it shall not be restricted thereto, but rather can be modified in diverse ways.

In particular, in the present exemplary embodiment, the parallel-serial converter according to the invention has deliberately been illustrated in a very simple manner, but without restricting the invention in this respect. In particular, other circuit variants can also be used for the configurations of the buffer store and of the bypass device provided that this bypass device continues to have the functionality according to the invention.

Moreover, a so-called prefetch-4 read access in which four data packets each having 8 bits are read out in each case need not necessarily be provided. An other prefetch read accesses in which fewer or else more data packets are read out per read access would also be conceivable. Furthermore, a respective data packet also need not necessarily comprise precisely 8 bits or one data word, but rather may have correspondingly more or fewer bits, for example 4 bits, 16 bits or 32 bits.

A parallel-serial converter having four inputs at which four data signals are present in parallel in each case has been described in each case in the above exemplary embodiment. However, the parallel-serial converter according to the invention shall not be restricted thereto, but rather can, of course, also be extended with more or fewer parallel input terminals.

The invention has furthermore been described by way of example for the use of a semiconductor memory designed in particular as a DDR semiconductor memory. However, the invention shall not be exclusively restricted thereto, but rather can likewise advantageously be used in arbitrary applications in which data present in parallel are intended to be converted into a serial signal.

Moreover, the invention shall also not be restricted to the types of transistors used. Rather, as many further circuit variants as desired can be specified by interchanging the transistor types and in particular by interchanging their conductivity types N for P and vice versa.

LIST OF REFERENCE SYMBOLS

1–4 Input terminals
5 Output terminal
6 Data eye
7–10 Inverters
11 Common storage node
12 Inverter
13 Output inverter
14 Feedback inverter
20 Parallel-serial converter
20A, 20B Parallel-serial converters
21 Buffer store, controllable latch
22 Common storage node
23 Control device
24 Inverter
25 Controllable transfer gate, bypass device
26 Bypass input, control input
26A, 26B Control inputs
27 Control input
28 OR gate
29 Output inverter, output driver
30 Output driver
31 PMOS transistor
32 NMOS transistor
33, 34 Supply terminals
35 Read line
36 Output of the semiconductor memory
37 Read path
CLK Clock signal, system clock
CLK' Complementary clock signal
D0–D3 Data present in parallel
Dout Serial data output signal
DoutA, DoutB Serial data output signals
FA0, FA1 Control signals
GND Reference potential
RD Control signal
RI0, RI1 Control signals
t1–t7 Instants
VDD Positive supply potential

What is claimed is:

1. A parallel-serial converter for converting parallel data into serial data for or in a DDR semiconductor memory, comprising:
at least n input terminals at which n data signals are present in parallel, and an output terminal for outputting a serial data signal;
a controllable latch connected to the input terminals on an input side;
a common storage node, which is connected to outputs of the latch and which holds a data signal of the controllable latch present last;
a controllable bypass device, which has an input, which is coupled to the storage node on an output side and which has a control terminal, via which a predeterminable state present at the input of the bypass device can be switched onto the storage node.

2. The converter according to claim 1, wherein the bypass device has a controllable transfer gate.

3. The converter according to claim 1, wherein the bypass device has an OR gate, which is connected to a control terminal of the transfer gate on the output side and to which the n parallel control signals can be fed on the input side.

4. The converter according to claim 1, wherein a fixed potential or a tristate potential is applied to the input of the bypass device.

5. The converter according to claim 1, wherein an adjustable value is applied to the input of the bypass device.

6. The converter according to claim 1, wherein the storage node has at least one first inverter for holding a last state of the latch, the inverter being arranged between the latch and the output of the parallel-serial converter.

7. The converter according to claim 1, wherein the parallel-serial converter is designed as a controllable shift register and has a number of second controllable inverters corresponding to a number of input terminals of the parallel-serial converter, the inverters being arranged in parallel with one another with regard to respective input terminals and output terminals.

8. The converter according to claim 7, wherein the second inverters are designed as tristate inverters.

9. The converter according to claim 1, further comprising a control device by means of which individual data signals which are present in parallel can be read successively into the latch and can be switched onto the storage node.

10. The converter according to claim 1, further comprising a multiplexer which is connected upstream of the control terminals of the controllable latch and which derives control signals for driving the second latch from a clock signal for the clock supply of the parallel-serial converter.

11. A semiconductor memory, comprising:
a cell array having a multiplicity of individual memory cells which can be read via a read path, the read-out being controllable by means of a control device connected to the cell array via at least one control path, wherein at least one parallel-serial converter is arranged in the read path between the cell array and the read line, the at least one parallel-serial converter including:
at least n input terminals at which n data signals are present in parallel, and an output terminal for outputting a serial data signal;
a controllable latch connected to the input terminals on an input side;
a common storage node, which is connected to outputs of the latch and which holds a data signal of the controllable latch present last;
a controllable bypass device, which has an input, which is coupled to the storage node on an output side and which has a control terminal, via which a predeterminable state present at the input of the bypass device can be switched onto the storage node.

12. The semiconductor memory according to claim 11, wherein at least two parallel-serial converters are provided for each read path, and in that a single output driver for driving the read-out parallel data signals on the read line is arranged between the two parallel serial converters and the read line, a respective parallel-serial converter being connected to a control terminal of a respective transistor of the output driver.

13. A method for operating a parallel-serial converter, comprising:
processing, in a first operating mode, data signals present in parallel at the input terminals of the parallel-serial converter; and
setting, in a second operating mode, in which no parallel data signals are present at the input terminals of the parallel-serial converter, the potential at the common storage node of the parallel-serial converter in a targeted manner by means of a bypass device in the second operating mode.

14. The method according to a claim 13, wherein, in the second operating mode, a tristate potential for setting a high-impedance tristate state is applied to the common storage node.

15. The method according to claim 13, wherein, in the second operating mode, an adjustable, digital value is applied to the common storage node.

16. The method according to claim 13, wherein a control signal for controlling the bypass device is derived from the parallel data signals.

* * * * *